(12) United States Patent
Pradhan et al.

(10) Patent No.: US 7,706,174 B2
(45) Date of Patent: Apr. 27, 2010

(54) STATIC RANDOM ACCESS MEMORY

(75) Inventors: Dhiraj Kumar Pradhan, Bristol (GB); Jawar Singh, Bristol (GB); Jimson Mathew, Bristol (GB)

(73) Assignee: The University of Bristol, Bristol (GB)

( * ) Notice: Subject to any disclaimer, the term of this patent is extended or adjusted under 35 U.S.C. 154(b) by 116 days.

(21) Appl. No.: 12/120,980

(22) Filed: May 15, 2008

(65) Prior Publication Data
US 2009/0285011 A1 Nov. 19, 2009

(51) Int. Cl.
*G11C 11/00* (2006.01)
(52) U.S. Cl. ........................ 365/156; 365/154
(58) Field of Classification Search ................ 365/156
See application file for complete search history.

(56) References Cited

U.S. PATENT DOCUMENTS

| 4,112,506 | A | * | 9/1978 | Zibu ............................. 365/181 |
| 5,353,251 | A | * | 10/1994 | Uratani et al. ........... 365/189.05 |
| 5,949,706 | A | * | 9/1999 | Chang et al. ................ 365/156 |
| 6,240,009 | B1 | | 5/2001 | Naffziger et al. |
| 6,751,151 | B2 | | 6/2004 | Hsu et al. |
| 6,754,121 | B2 | * | 6/2004 | Worley ....................... 365/207 |
| 2006/0146638 | A1 | | 7/2006 | Chang et al. |
| 2007/0025140 | A1 | | 2/2007 | Redwine |
| 2007/0189061 | A1 | | 8/2007 | Buettner et al. |

OTHER PUBLICATIONS

Zhang et al., SRAM Design on 65nm CMOS Technology With Dynamic Sleep Transistor for Leakage Reduction, Journal, Apr. 2005, pp. 895-901, vol. 40, No. 4, IEEE Journal of Solid-State Circuits.
Yabuuchi et al., A 45nm Low-Standby-Power Embedded SRAM with Improved Immunity Against Process and Temperature Variations, Journal, 2007, pp. 326, 327 and 606, Session 18, SRAM 18.3, IEEE International Solid-State Circuits Conference.
Kwang-Jin Lee et al., A 90nm 1.8V 512 Mb Diode-Switch PRAM With 266 MB/s Read Throughput, Journal, Jan. 2008, pp. 150-162, vol. 43, No. 1., IEEE Journal of Solid-State Circuits.
Tae-Hyoung Kim et al., A 0.2V, 480 kb Subthreshold SRAM with 1k Cells Per Bitline For Ultra-Low Voltage Computing, Feb. 2008, pp. 518-529, Journal, vol. 43, No. 2, IEEE Journal of Solid-State Circuits.

(Continued)

*Primary Examiner*—Tan T. Nguyen
(74) *Attorney, Agent, or Firm*—Alston & Bird LLP

(57) ABSTRACT

A static random access memory ("SRAM") comprising: a pair of inverters each having an input and an output; a cross-coupling path coupling the input of a first inverter to the output of a second inverter; and a transmission gate, wherein the transmission gate comprises a p-channel transistor coupling the input of the second inverter to the output of the first inverter; and an n-channel transistor coupling the input of the second inverter to the output of the first inverter in parallel with the p-channel transistor. In another embodiment, the SRAM comprises a first inverter having a supply voltage node connected to a supply voltage, and a ground node connected to ground; a second inverter cross-coupled with the first inverter and having a supply voltage node connected to a supply voltage, and a ground node; and a switch selectively connecting and disconnecting the ground node of the second inverter to ground.

4 Claims, 5 Drawing Sheets

OTHER PUBLICATIONS

Hiroyuki Yamauchi et al., A 1R/1W SRAM Cell Design to Keep Cell Current and Area Saving against Simultaneous Read/Write Distributed Access, Apr. 2007, pp. 749-757, vol. E90-C, No. 4., The Institute of Electronics, Information and Communication Engineers.

Koji Nii et al., A 45-nm Bulk CMOS Embedded SRAM With Improved Immunity Against Process and Temperature Variations, Journal, Jan. 2008, pp. 180-191, Journal, vol. 43, No. 1., IEEE Journal of Solid-State Circuits.

Benton H. Calhoun et al., A 256kb Sub-threshold SRAM in 65nm CMOS, 2006, pp. 628, 629 and 678, Session 34, SRAM 34.4, IEEE International Solid-State Circuits Conference.

Koichi Takeda et al., A Read-Static-Noise Margin Free SRAM Cell for Low-VDD and High Speed Applications, Journal, Jan. 2006, pp. 113-121, vol. 41, No. 1, IEEE Journal of Solid-State Circuits.

Subhasis Bhattacharjee et al., LPRAM: A Novel Low-Power High-Performance RAM Design with Testability and Scalability, Journal, May 2004, pp. 637-651, vol. 23, No. 5, IEEE Transactions on Computer-Aided Design of Integrated Circuits and Systems.

Ahmad A. Al-Yamani, A Defect Tolerance Scheme for Nanotechnology Circuits, Regular Papers, Nov. 2007, pp. 2402-2409, vol. 54, No. 11, IEEE Transactions on Circuits and Systems- I: Regular Papers.

Ramy E. Aly et al., Low-Power Cache Design Using 7T SRAM Cell, Express Briefs, Apr. 2007, pp. 318-322, vol. 54, No. 4, IEEE Transactions on Circuits and Systems II: Express Briefs.

Ramy E. Aly et al., Novel 7T SRAM cell for low power cache design, Sep. 25-28, 2005, pp. 171-174, IEEE International SOC Conference—The Center of Advanced Computer Studies.

Carlson et al., A High Density, Low Leakage 5T SRAM for Embedded Caches, Sep. 2004, pp. 215-218, IEEE Proceedings of the 30$^{th}$ European Solid-State Circuits Conference.

Chang et al., Stable SRAM Cell Design for the 32nm Node and Beyond, Digest, Jun. 2005, pp. 128-129, IBM Semiconductor Research and Development Center.

Kulkarni et al., A 160 mV Robust Schmitt Trigger Based Subthreshold SRAM, Journal, Oct. 2007, pp. 2303-2313, vol. 42; No. 10, IEEE Journal of Solid-State Circuits.

* cited by examiner

STATIC RANDOM ACCESS MEMORY

FIELD OF THE INVENTION

The present invention relates to a static random access memory.

BACKGROUND OF THE INVENTION

Embedded systems particularly targeted towards portable applications require extremely low energy consumption as they are often battery powered. In these embedded systems memory consumes a significant portion of the total system power budget; thus memory power reduction is crucial. Lowering supply voltage is one of the options to reduce power (energy) consumption. However, ultra-low-power design of high-density Static Random Access Memory (SRAM) in which the operating voltage is below the transistor threshold voltage is extremely challenging. This is due to reduced static noise margin (SNM) and increased variability in design and process parameters in nanoscale CMOS (nano-CMOS) technology. Therefore, reducing the operating voltage for memory to reduce the leakage power and active energy in energy constraint applications is a major challenge.

In modern System on Chips (SoCs) devices when total power and total area is dominated by the SRAM, reduction in its supply voltage (Vdd) can save both active energy and leakage power during stand-by operation. Hence, supply voltage scaling is the first choice of semiconductor manufacturers for ultra-low-power applications. Also for system integration, SRAM must be compatible with sub-threshold combinational logic operating at ultra-low voltages. However, this leads to an increase in sensitivity of design and process parameter variability. This problem will worsen in nanometer technologies with ultra-low voltage operation and makes SRAM design and stability analysis more challenging.

Process variations have a major impact in both the inter-die and intra-die threshold voltage variation due to random dopant fluctuations in small geometry SRAM cell transistors. Consequently, there are major concerns over SRAM cell stability as well as the integrity of read and write operations in future nano-CMOS designs. This may lead to poor yield and density requirements due to: degraded static noise margin (SNM); poor write-ability; increased sensitivity of design; and severe variations in process parameters. Moreover, the density requirement is mainly limited by the poor driving capacity of bit-lines, which allows fewer cells per bit-line and reduced bit-line sensing margin.

Different types of SRAM bitcells consisting of five, seven, eight, and ten transistors, have been proposed to improve the yield, density and failure probability due to poor SNM, write-ability and process variations.

The 5-transistor bitcell proposed by Carlson et al in "A high density, low leakage, 5T SRAM for embedded caches", Solid-State Circuits Conference 2004, ESSCIRC 2004, Proceeding of the 30th European, pages 215-218, 21-23 Sep. 2004 employs a single-ended input/output (I/O) line for reading and writing which requires additional sensing circuitry for reliable read operation. In the 7-transistor bitcell proposed by Aly et al in "Novel 7T SRAM cell for low power cache design", SOC conference, 2005, Proceedings IEEE International, pages 171-174, 19-23 September 2005, a differential read operation is performed, while, during write operations, a feedback connection between inverters is disconnected to improve the read SNM. In the 8-transistor bitcell proposed by Chang et al in "Stable SRAM cell design for the 32 nm node and beyond", VLSI Technology, 2005. Digest of Technical Papers, 2005 Symposium on, pages 128-129, 14-16 Jun. 2005, two additional NMOS transistors are included to decouple the cell and separate read and write word-lines are used to improve the read stability. A 10-transistor subthreshold bitcell proposed by Calhoun et al in "A 256 kb 65 nm sub-threshold SRAM design for ultra-low voltage operation", IEEE Journal of Solid-State Circuits, 42(3): 680-688, March 2007 uses a buffer for reading to improve the read SNM. Read access is single ended and employs separate read and write word-lines. A 160 mV robust Schmitt trigger based sub-threshold SRAM bitcell proposed by Kulkarni et al in "A 160 mV robust Schmitt trigger based subthreshold SRAM", Solid State Circuits, IEEE Journal of, 42(10): 2303-2313, October 2007 focuses on making the basic inverter pair of the memory cell robust to improve the stability of the cross-coupled inverters. Here, we will refer to this cell as 10T-ST for subsequent discussions. In the literature, the read SNM of the 7-transistor, 8-transistor and 10-transistor SRAM cells has been improved by decoupling the bitcell nodes from the bit-lines during the read access, hence making the read SNM equal to the hold SNM. However, in 10T-ST, the read SNM has been improved by strengthening the inverter pairs. The write-ability has been improved in prior designs by using virtual supply voltage for write access transistors at the cost of generating and routing an extra supply voltage.

The limitations of current designs motivates the exploration of an alternative SRAM bitcell structure that will be suitable for nano-CMOS circuits for targeted ultra-low-power applications.

SUMMARY OF THE INVENTION

A first aspect of the invention provides a static random access memory comprising: a pair of inverters each having an input and an output; a cross-coupling path coupling the input of a first one of the inverters to the output of a second one of the inverters; and a transmission gate. The transmission gate comprises: a p-channel transistor coupling the input of the second one of the inverters to the output of the first one of the inverters; and an n-channel transistor coupling the input of the second one of the inverters to the output of the first one of the inverters in parallel with the p-channel transistor.

A second aspect of the invention provides a method of operating the static random access memory, the method comprising: switching the transistors of the transmission gate from an ON state to an OFF state to disconnect the input of the second one of the inverters from the output of the first one of the inverters; accessing the memory, for instance in a read operation or a write operation, with the transistors of the transmission gate in the OFF state; and switching the transistors of the transmission gate from the OFF state to the ON state after the access operation in order to reconnect the input of the second one of the inverters to the output of the first one of the inverters.

A third aspect of the invention provides a static random access memory comprising: a first inverter having a supply voltage node connected to a supply voltage, and a ground node connected to ground; a second inverter cross-coupled with the first inverter and having a supply voltage node connected to a supply voltage, and a ground node; and a switch for selectively connecting and disconnecting the ground node of the second inverter to and from ground.

A fourth aspect of the invention provides a method of operating a static random access memory, the memory comprising a pair of cross-coupled inverters each having a supply voltage node connected to a supply voltage, and a ground node connected to ground, the method comprising disconnecting the ground node of one of the inverters from ground during a write operation.

Various preferred features of the invention are described in the dependent claims.

BRIEF DESCRIPTION OF THE DRAWINGS

Embodiments of the invention will now be described with reference to the accompanying drawings, in which.

DETAILED DESCRIPTION OF EMBODIMENT(S)

Figure 1:
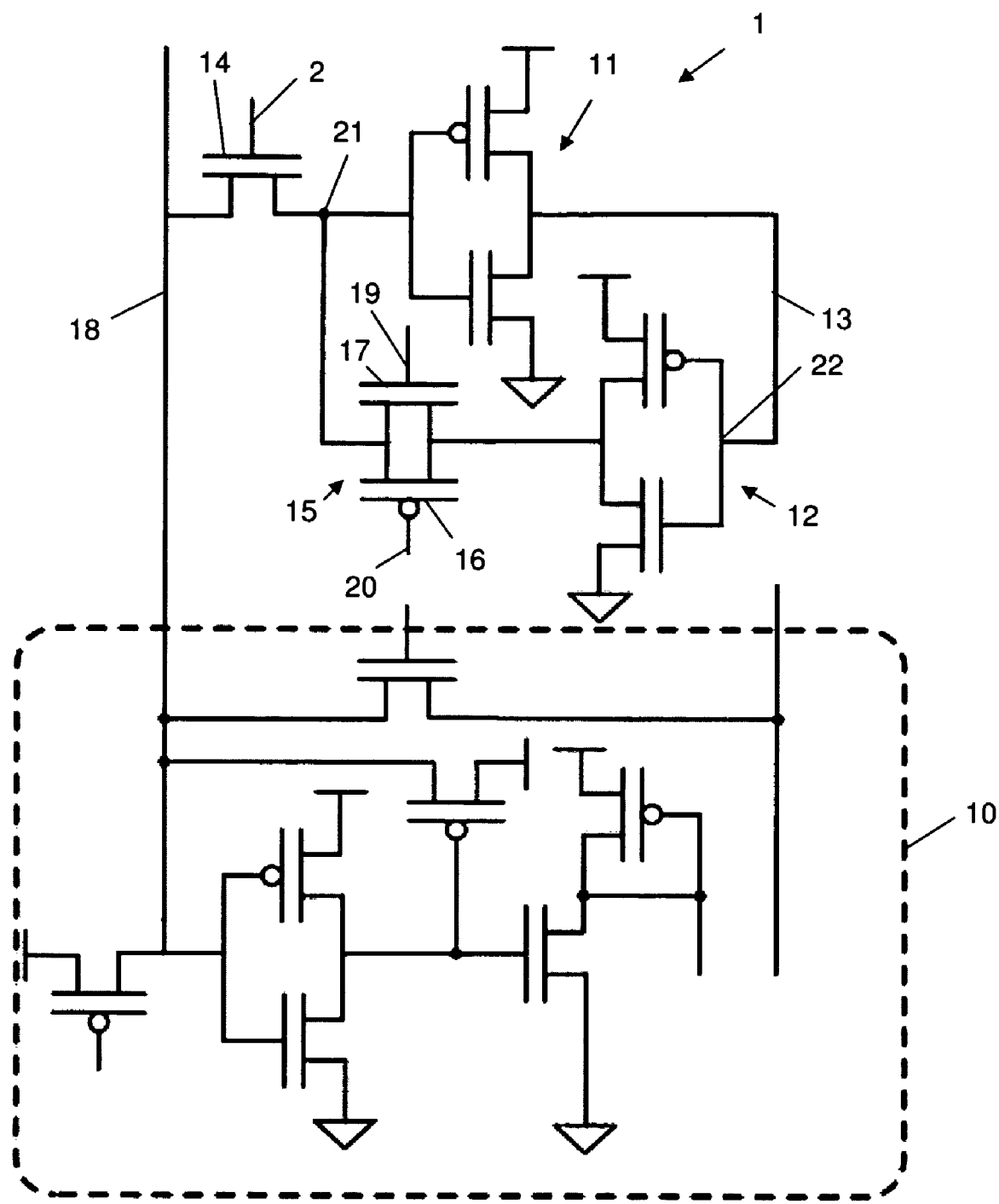
FIG. 1 is a circuit diagram of a 7-transistor SRAM bitcell structure along with the read and write circuitry.

A proposed 7-transistor Latch-Style Static Random Access Memory (7T-LSRAM) bitcell is shown in FIG. 1 along with read and write circuitry 10. The SRAM bitcell 1 consists of an inverter pair 11, 12, a read and write access transistor 14, and a transmission gate (TG) 15. The output of the inverter 11 is permanently connected to the input of the inverter 12 via a first cross-coupling path 13. Rather than having two bit-lines as in standard SRAM bitcells, these lines have been replaced by a Single Ended Input/Output (SEIO) bit-line 18. Both reading and writing operations are performed over this bit-line 18. A word-line 2 asserts a logic "1" in order to switch on access transistor 14 prior to write and read operations.

The TG 15 comprises PMOS and NMOS transistors 16, 17. The PMOS transistor 16 couples the input of the inverter 11 to the output of the inverter 12; and the NMOS transistor 17 couples the input of the inverter 11 to the output of the inverter 12 in parallel with the PMOS transistor 16. The transistors 16, 17 are switched ON and OFF together by a controller (not shown). By switching the transistors 16, 17 on together, the cross-coupling path between the output of the inverter 12 and the input of the inverter 11 is completed (in addition to the permanent cross-coupling path 13 between the output of the inverter 11 and the input of the inverter 12). This configuration allows the TG 15 to pass either a perfect logic "0" or a perfect logic "1", preventing any loss of signal integrity. Similarly, by switching the transistors 16, 17 off together, the TG 15 can be opened, removing the feedback connection between the inverters 11, 12.

During a data retention period between read access or write access operations, the word-line 2 is low and the TG 15 is switched to an ON state to provide a strong feedback between the cross-coupled inverters 11, 12.

Write Operation of the 7T-LSRAM Bitcell

The write operation begins with asserting the word line 2 high (to turn on access transistor 14) and disconnecting the feedback between inverters, 11, 12. The feedback connection is switched OFF through the TG 15 with appropriate write control signals W (on line 20) and WB (on line 19) which are complements of one another. Once the feedback between the inverters is disconnected, read/write node 21 is charged/discharged to an equivalent logic level 1/0. Node 22 stores the complement of node 21.

Figure 2:
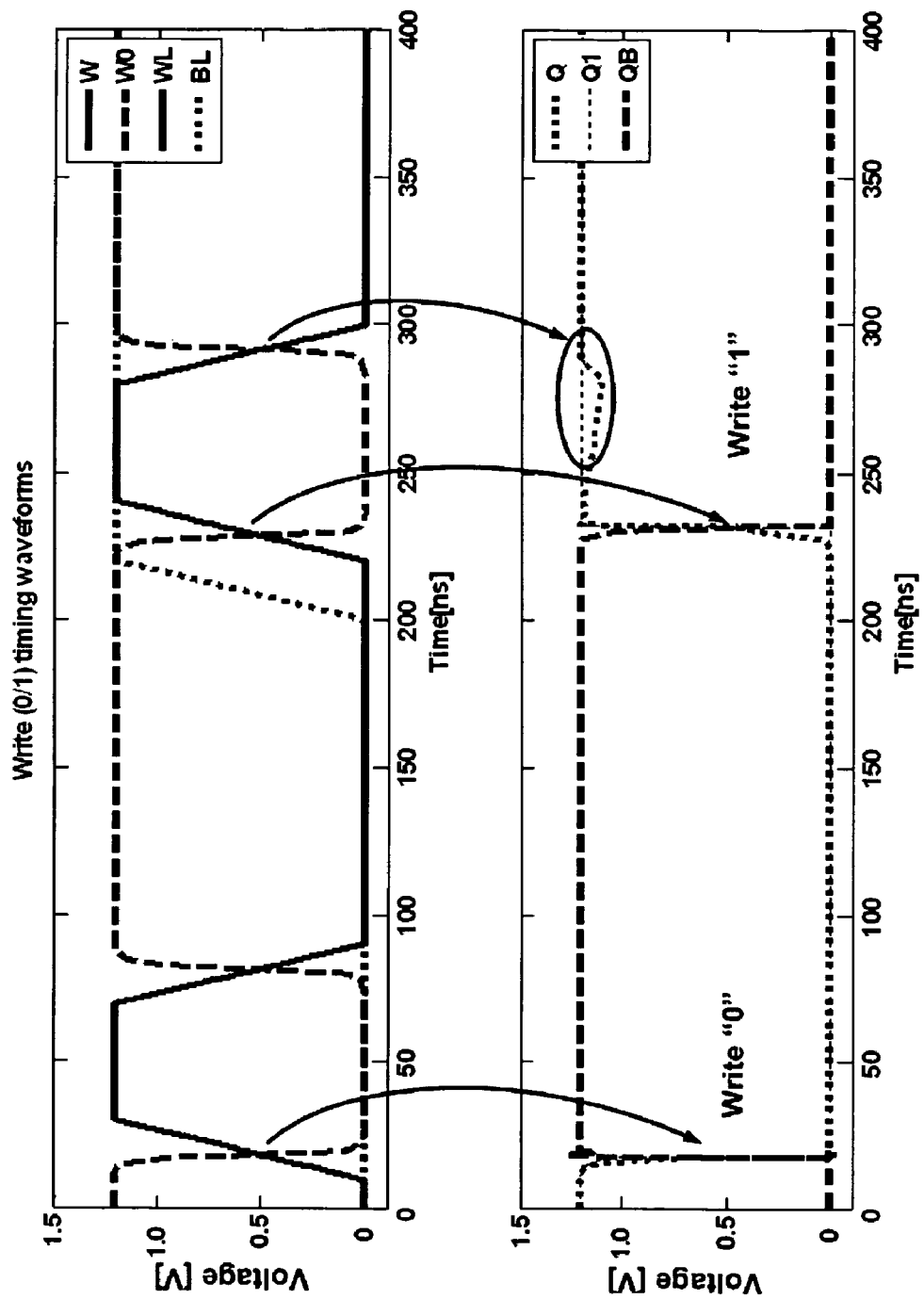
FIG. 2 displays timing waveforms showing write '0' and '1' at the read node of the proposed 7-transistor design.

To illustrate a write 0/1 operation, initially we assume that the node 21 is at logic level "1" and node 22 is at logic level "0". FIG. 2 shows a simulated timing diagram for write "0" and "1" operations. In FIG. 2, the voltage at node 21 is marked 'Q' and the voltage at node 22 is marked 'QB'. Similarly, the control signal 20 fed to the NMOS transistor 16 is labelled W, the control signal 19 fed to the PMOS transistor 17 is labelled W0, the voltage on word-line 2 is labelled WL and the voltage on bit-line 18 is labelled BL. During write access, the word-line 2 goes high which connects the bit-line 18 to node 21. Also the signal W goes high which turns off the TG 15. After a write operation, the TG 15 is turned on and the feedback connection restores the voltage level "1" at node 21.

As described above, the feedback loop between the inverters is connected and disconnected through TG 15 which improves the write-ability, in other words a successful write to the memory. This significantly reduces the chance of an error occurring in the writing operation.

Read Operation of the 7T-LSRAM Bitcell

Prior to read access, both the word-line 2 and bit-line 18 are pre-charged to logic level "1". The access transistor 14 provides a path to the storage node 21 to charge/discharge the bit line to an equivalent logic level I/O. The use of single bit line 18 and TG 15 provides strong coupling between the inverters 11, 12 and prevents the "0" internal storage node 21 (or 22) of the bitcell from being elevated to a voltage higher than ground.

Figure 3:
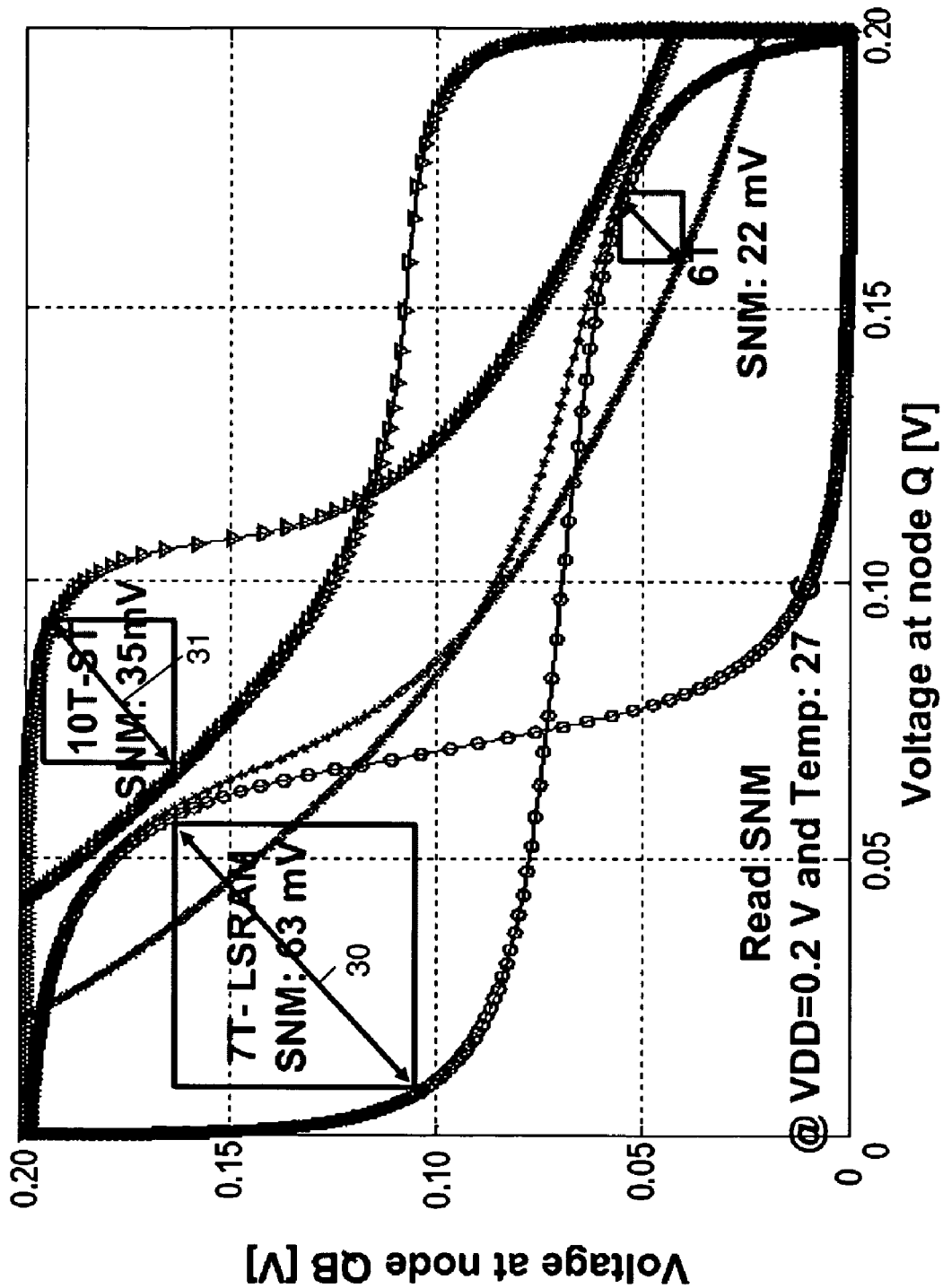
FIG. 3 shows a read SNM comparison of the existing 10-transistor bitcells with that of the proposed 7-transistor design at Vdd=0.2V.
Figure 4:
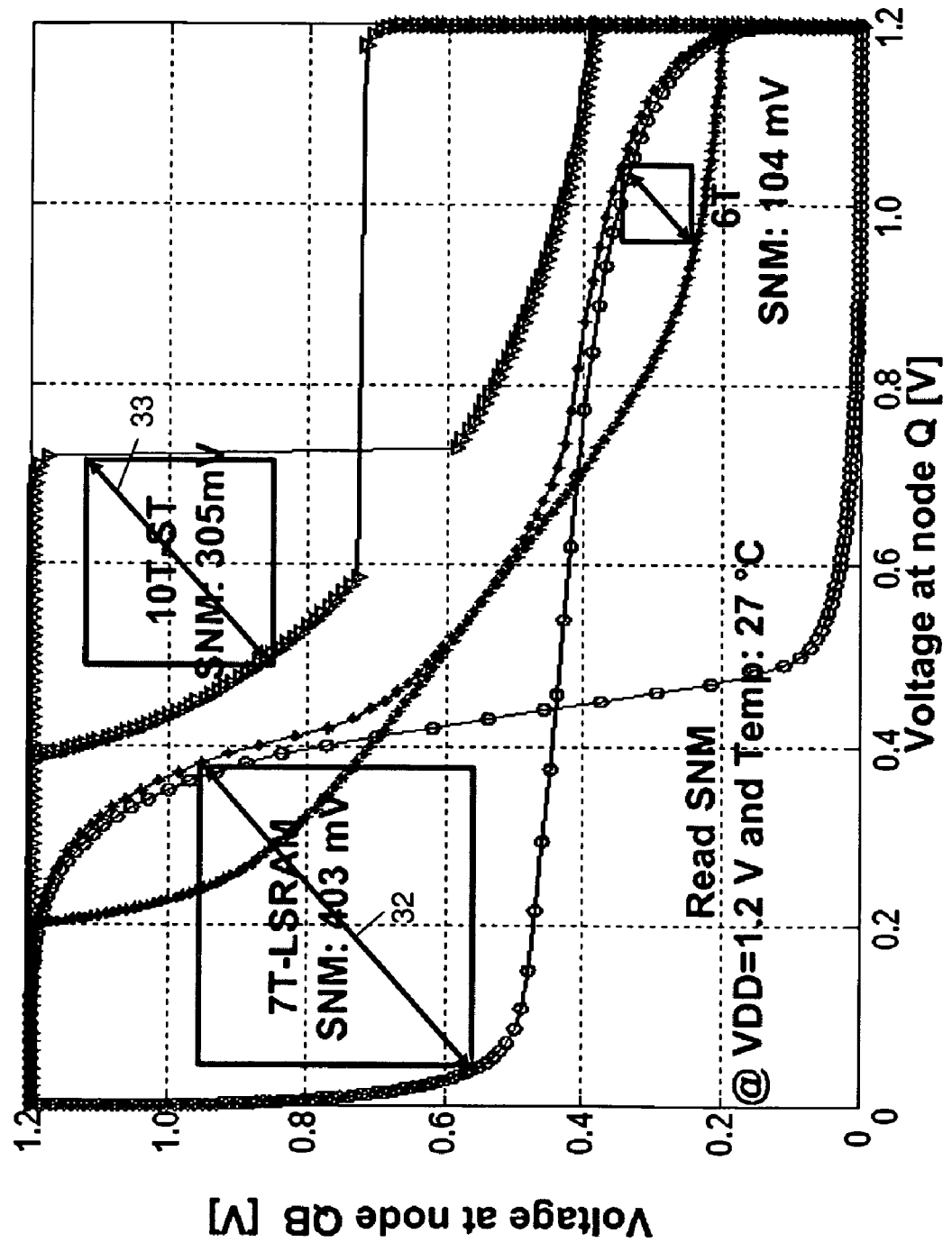
FIG. 4 shows the graph of FIG. 3 with Vdd=1.2V.

As discussed, the proposed 7T-LSRAM has two nodes 21, 22 which hold the stored binary data in the bit cell. Node 22 is positioned between the two inverters 11, 12; consequently the logic value stored at node 22 is the complement of the logic value at node 21. Conventional bit cells, such as the 10T-ST, have similar nodes containing the stored logic value and its complement. Conventionally, the stored logic value is labelled 'Q' and its complement is labelled QB. FIGS. 3 and 4 show plots of Q vs. QB for the 7T-LSRAM and the 10T-ST bitcells which arise when the logic value stored at Q is changed from a 0 to a 1 and vice versa. In FIG. 3, the supply voltage, Vdd is 0.2V while in FIG. 4, the supply voltage Vdd is 1.2V.

Due to their shape, these plots are known as 'butterfly curves'. The first lobe of the butterfly curve for each bitcell arrangement can be obtained by asserting a voltage at node Q and monitoring the voltage at node QB. The second lobe can be obtained by asserting a voltage at node QB and monitoring the voltage at node Q.

Static Noise Margin (SNM) voltage is considered to be the best measure for read and hold stability. This can be estimated graphically as the length of the diagonal of the largest square that can be embedded inside the lobes of the butterfly curve.

Example SNM measurements are shown for the 7T-LSRAM and 10T-ST designs by arrows 30-33 in FIGS. 3 and 4. As shown in FIG. 3, the proposed 7T-LSRAM design has a read SNM equivalent to hold state SNM, even at reduced Vdd=0.2V. The 7T-LSRAM bitcell read stability is therefore not degraded during read access.

Moreover, the comparison between the 7T-LSRAM SNM 30 and 10T-ST SNM 31 in FIG. 3 shows that, in the subthreshold regime (at Vdd=0.2V) the improvement in read SNM is about 1.8× compared to 10T-ST bitcells. The comparison between the 7T-LSRAM SNM 32 and 10T-ST SNM 33 in FIG. 4 also shows that the 7T-LSRAM bitcell has about 1.3× improvement in the read SNM compared to the 10T-ST bitcells at Vdd=1.2 V.

Comparison of Write-ability

Write-ability of an SRAM bitcell is best characterized using write-trip-point voltage (WTPV), which determines how expensive it is in terms of energy to write to a bitcell. The lower the write trip point, the higher pulling down energy is required and vice-versa. The WTPV defines the maximum voltage on the bit-line needed to flip the bitcell content.

The WTPV of the 7T-LSRAM cell is about 27% less than the 10T-ST at Vdd=1.2 V. Thus, it can be concluded that the writing operation of the proposed 7T-LSRAM bitcell is about 27% more expensive in terms of energy consumption as compared to 10T-ST SRAM bitcells. In other words, the 7T-LSRAM is more robust to noise that can cause undesirable write operations, because it requires more energy to pull down the bit-line to change the bitcell state. Also after the write-trip-point, both the internal nodes change from 1 to 0 or from 0 to 1 perfectly, whereas in the 10T-ST SRAM bitcell one state of the internal nodes floats after the trip-point and is more susceptible to noise. In the subthreshold regime at Vdd=0.3 V the WTPV is 26% lower than that of 10T-ST SRAM bitcells. Thus, it can be concluded that the write operation of the 7T-LSRAM bitcell is more robust as compared to 10T-ST SRAM bitcells which is the prime requirement of the subthreshold nano-CMOS regime.

Scalability

The 7T-LSRAM bitcell has been simulated using the Berkley predictive technology model (BPTM) and compared with the 10T-ST bitcells. The results suggest that the 7T-LSRAM bitcell has better SNM (read and hold) and WTPV (write), compared to the 10T-ST bitcells. Moreover, an improvement is also predicted in the static power noise margin (SPNM) and the write trip power (WTP). For Vdd=0.3 V, using predictive models, the 7T-LSRAM bitcell predicts 1.8× improvement in read SNM compared to its 10T-ST counterpart.

Thus the proposed 7T-LSRAM bitcell scales well with future technologies. As mentioned earlier, with increased process variations, the memory bitcell failure would probability worsen at lower supply voltages. Simulation shows that the proposed 7T-LSRAM bitcell has better process variation tolerance than the 10T-ST.

8T Design

Figure 5:
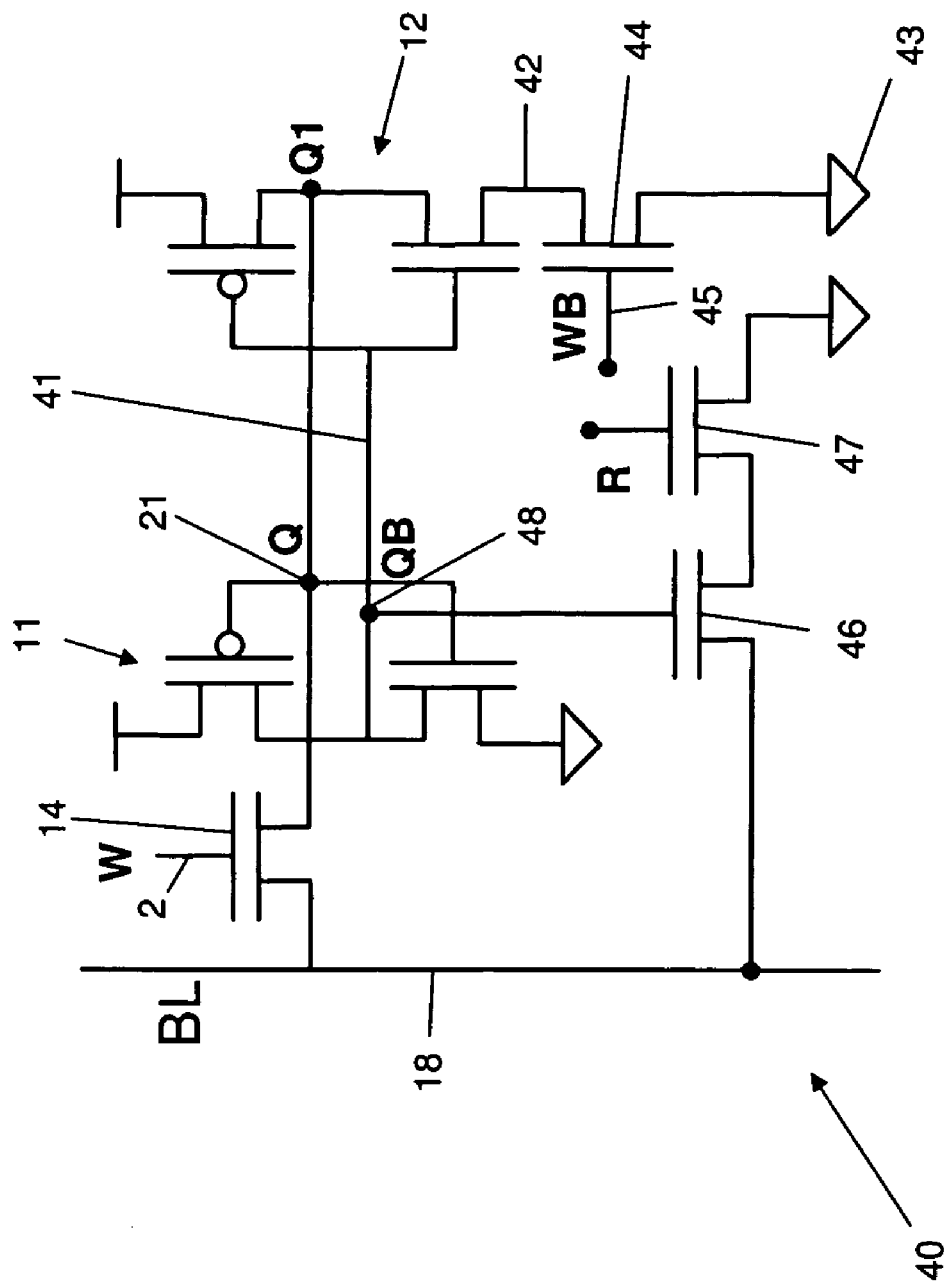
FIG. 5 is a circuit diagram of an 8-transistor SRAM bitcell structure.

An 8 transistor SRAM cell 40 is shown in FIG. 5. The cell of FIG. 5 is similar to the cell of FIG. 1, and equivalent circuit elements are given the same reference numeral.

The SRAM cell 40 comprises an inverter pair 11, 12, and a read and write access transistor 14. The output of the inverter 12 is permanently connected to the input of the inverter 11 via a first cross-coupling path 41. Rather than having two bit-lines as in standard SRAM bitcells, these lines have been replaced by a Single Ended Input/Output (SEIO) bit-line 18 carrying a signal denoted BL in FIG. 5. Both reading and writing operations are performed over this bit-line 18.

The write operation is similar to the 7T cell of FIG. 1, except instead of opening the feedback loop using a transmission gate, in the 8T design, for a successful write, the ground node 42 of one of the inverters (in this case inverter 12 but it could equally be the inverter 11) is disconnected from ground 43 by a transistor 44 so that the ground node 42 is floating. The transistor 44 is controlled by a word-line 45 which carries the complement (WB) of the signal (W) on word-line 2.

In the 8T design, better read-ability is achieved by not disturbing the node 21 (which carries a signal denoted Q in FIG. 5). For the read operation, transistors 46 and 47 are used, the transistor 47 being controlled by a signal denoted R in FIG. 5. In contrast to the arrangement of FIG. 1 in which the voltage Q at node 21 is sensed directly, in the case of FIG. 5 the voltage at node 21 is sensed indirectly from node 48 (which carries the complement QB of the signal Q at node 21). The working of the cell also requires pre-charging of the bit-line 18 (BL=1) prior to read and write operations.

In order to read bit level '0' (i.e. Q=0, W=0, BL=1 (pre-charged) and R=1) transistors 46 and 47 are turned on, thereby pulling the bit line 18 to ground. Thus the bit line voltage BL indicates the voltage at node 21. On the other hand, if node 21 is at a high level '1' (QB at '0'), transistor 46 is turned off and the bit line 18 keeps the pre-charged voltage, hence indicating that node 21 has a high level (Q=1). It is important to note that during the read operation, the bit line 18 is not connected to node 21 (because W=0), so that both nodes 21 (Q) and 48 (QB) are isolated from the bit line 18. This makes the read SNM high.

For a write operation (i.e. W=1, BL=1 (pre-charged), and R=0) the transistor 44 is turned off which keeps the inverter 12 floating (i.e. disconnected from ground) thus allowing a successful write to the node 21 (Q). During the write operation, BL remains high to write a binary "1" and BL drops to zero to write a binary "0". Also the transistor 47 is switched off (as R=0) which isolates the bit line 18 from ground. Thus, the bit line 18 changes the state of node 21 (Q) appropriately (either low or high) according to the data on the bit line 18.

Although the invention has been described above with reference to one or more preferred embodiments, it will be appreciated that various changes or modifications may be made without departing from the scope of the invention as defined in the appended claims.

The invention claimed is:

1. A static random access memory comprising:
   a. a first inverter having a supply voltage node connected to a supply voltage, and a ground node connected to ground;
   b. a second inverter cross-coupled with the first inverter and having a supply voltage node connected to a supply voltage, and a ground node; and
   c. a switch for selectively connecting and disconnecting the ground node of the second inverter to and from ground; and
   wherein each inverter has a Q node and a QB node, and the memory further comprises:
   d. a bit-line;
   e. a write switch for selectively connecting the bit line to the Q nodes of the inverters during a write operation; and
   f. a pair of read switches connected in series between the bit line and ground, the read switches comprising:
      i. a first read switch controlled by a read signal; and
      ii. a second read switch controlled by the voltage at the QB nodes of the inverters.

2. The memory of claim 1 wherein the read switches are transistors.

3. The memory of claim 1 wherein the read switches are MOSFETs.

4. A method of operating a static random access memory, the memory comprising a pair of cross-coupled inverters each having a supply voltage node connected to a supply voltage, and a ground node connected to ground, the method comprising disconnecting the ground node of one of the inverters from ground during a write operation; and wherein each inverter has a Q node and a QB node, the method further comprising:
   a. writing from a bit line to the Q nodes of the inverters during a write operation;
   b. pre-charging the bit line prior to the read operation; and
   c. connecting the bit line to ground during the read operation if the voltage at the QB nodes is high.

* * * * *